(12) United States Patent
Blatchford

(10) Patent No.: US 8,584,053 B2
(45) Date of Patent: Nov. 12, 2013

(54) MANUFACTURABILITY ENHANCEMENTS FOR GATE PATTERNING PROCESS USING POLYSILICON SUB LAYER

(75) Inventor: James Walter Blatchford, Richardson, TX (US)

(73) Assignee: Texas Intruments Incorporated, Dallas, TX (US)

( * ) Notice: Subject to any disclaimer, the term of this patent is extended or adjusted under 35 U.S.C. 154(b) by 103 days.

(21) Appl. No.: 13/166,738

(22) Filed: Jun. 22, 2011

(65) Prior Publication Data

US 2012/0331425 A1 Dec. 27, 2012

(51) Int. Cl.
*G06F 17/50* (2006.01)

(52) U.S. Cl.
USPC .............. 716/50; 716/53; 716/54; 716/55

(58) Field of Classification Search
USPC ......................................... 716/50, 54
See application file for complete search history.

(56) References Cited

U.S. PATENT DOCUMENTS

| 7,737,016 | B2 | 6/2010 | Blatchford et al. |
| 7,785,946 | B2 * | 8/2010 | Haffner et al. ............... 438/183 |
| 2009/0169832 | A1 | 7/2009 | Aton |

* cited by examiner

*Primary Examiner* — Vuthe Siek
*Assistant Examiner* — Eric Lee
(74) *Attorney, Agent, or Firm* — Jacqueline J. Garner; Wade J. Brady, III; Frederick J. Telecky, Jr.

(57) ABSTRACT

A method for designing a mask set including at least one mask includes the implementation of at least one design rule from a set of design rules. The design rules include rules relating to allowable spacing between adjacent features, overlap of features defined by different masks in the mask set, and other characteristics of the mask set.

15 Claims, 12 Drawing Sheets

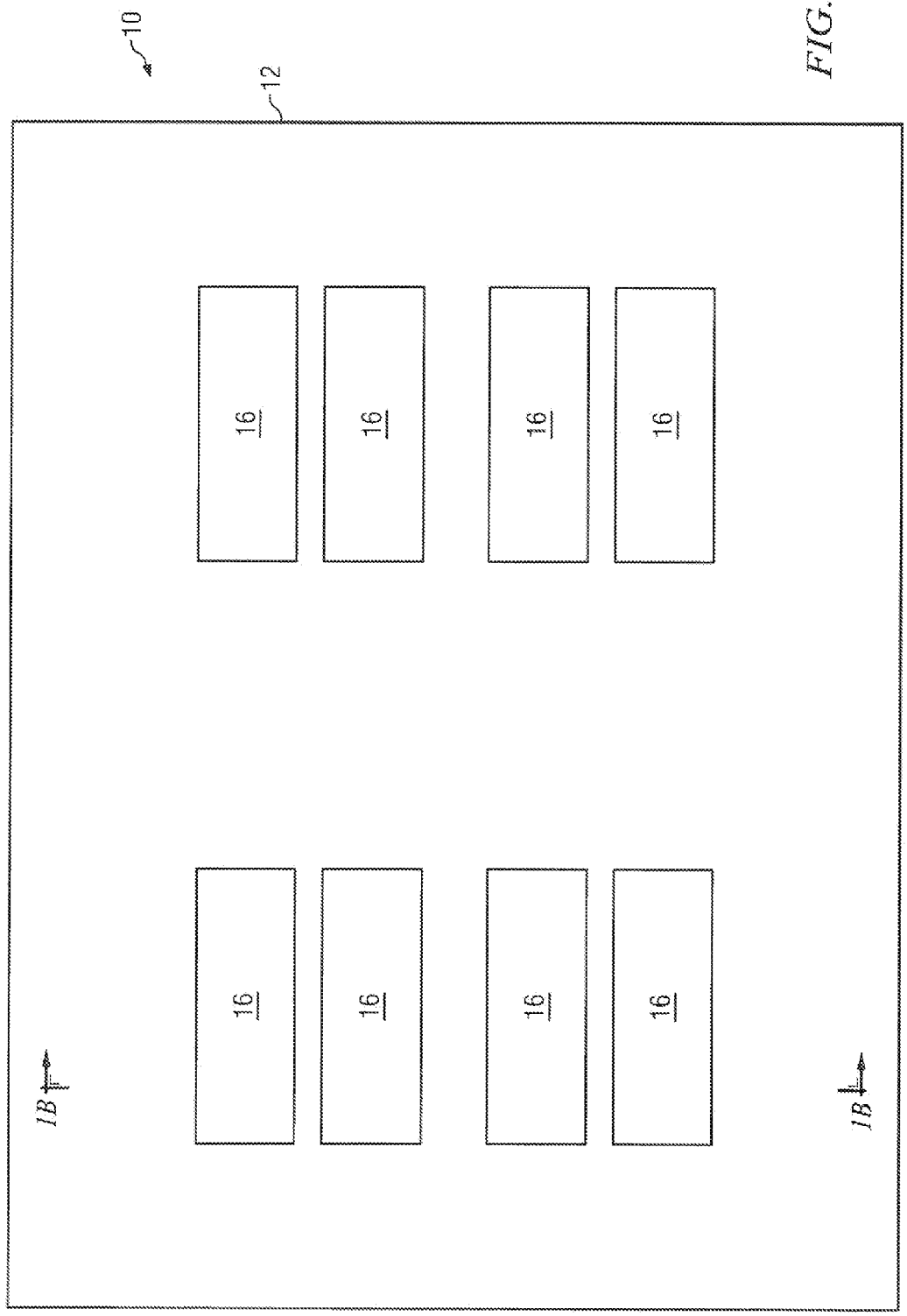

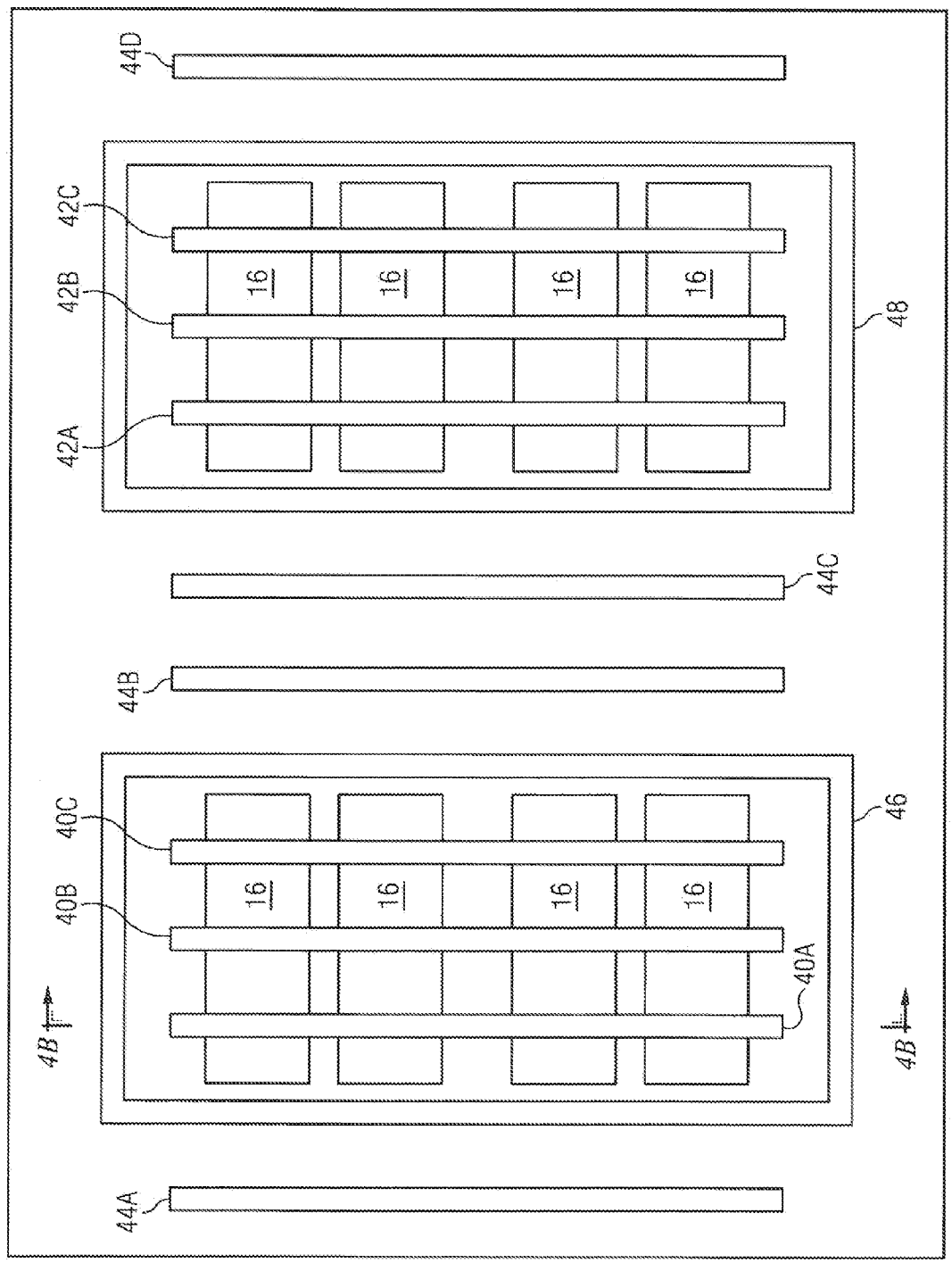

MANUFACTURABILITY ENHANCEMENTS FOR GATE PATTERNING PROCESS USING POLYSILICON SUB LAYER

TECHNICAL FIELD

The present teachings relate to the field of integrated circuits, and more specifically to optical photolithography and semiconductor device structures and their method of formation using optical photolithography.

BACKGROUND

Conventional optical projection lithography has been the standard silicon patterning technology in semiconductor manufacturing processes, for example, in the fabrication of integrated circuits (ICs). An optical projection lithography process can include a patterned mask with a semiconductor circuit layout pattern which is used to image the pattern onto a photosensitive layer, for example photoresist. The photoresist covers a layer to be patterned such as a polysilicon layer which is part of a semiconductor wafer. Layouts used to create such masks are typically generated using computer-aided design (CAD) programs, sometimes called electronic design automation (EDA).

One goal in IC fabrication is to faithfully reproduce the original circuit design or layout on the wafer, specifically into the layer to be patterned, using the designed mask. Another goal is to use as much of the wafer real estate as possible. As the size of an IC is reduced and its density increases, however, the critical dimension of its corresponding mask approaches the resolution limit of the optical exposure tool. Critical dimension (i.e., CD), for purposes of this disclosure, is the smallest physical dimension printable on a wafer below which the feature size is not reliably reproducible. For example, transistor matching requirements for advanced technology nodes, such as less than 1.0 µm, require exquisite CD control, beyond the capability of current lithography and etch tools and processes. An important component of variation is matching between transistor gates in the interior of an array of active gates, e.g., over the same active region, and those on the end of the array. For example, for the 45 nm technology node, the printed transistor gates at the ends of the gate array might vary from their designed size by an amount which is 2 to 3 times the variation of the transistor gates at the interior of the array.

Features such as polysilicon transistor gates can be formed with a process which uses a single mask exposure of the photosensitive layer and a single etch using the patterned photosensitive layer to etch an underlying layer such as a polysilicon layer to form the polysilicon transistor gates. In this process, the layer to be etched, for example, the blanket polysilicon layer; is formed, then the photosensitive layer is formed over the polysilicon layer. A light source is patterned by the mask, the patterned light source exposes the photoresist, then the exposed photoresist (positive resist) or the unexposed photoresist (negative resist) is removed to pattern the photoresist. The polysilicon layer is then etched using the patterned photoresist as a pattern. Subsequently, the patterned photoresist is removed and wafer processing can continue.

In semiconductor device design, an extension of a transistor gate past the active region is an important consideration. Without sufficient extension of the transistor gate past the end of the active region, line end shortening and corner rounding can pull the end of the transistor gate back to such an extent that device leakage can occur, severely compromising the device performance. In some cases, a device can be rendered inoperable. U.S. Pat. Publication 2009/0169832, which is incorporated by reference herein in its entirety, describes problems associated with line end shortening.

A process which provides a more faithful reproduction of a circuit layout within a resist layer and, therefore, within a layer underlying the resist layer, would be desirable.

SUMMARY OF THE EMBODIMENTS

The following presents a simplified summary in order to provide a basic understanding of some aspects of one or more embodiments of the present teachings. This summary is not an extensive overview, nor is it intended to identify key or critical elements of the present teachings nor to delineate the scope of the disclosure. Rather, its primary purpose is merely to present one or more concepts in simplified form as a prelude to the detailed description presented later.

The present teachings can include a method for designing a mask set for patterning a mask layer for a semiconductor device. In an embodiment, the semiconductor device can include a plurality of active regions and a transistor gate array comprising a plurality of transistor gate lines. The method can include designing a first mask set for etching the transistor gate array during a first etch and designing a second mask set for etching the transistor gate array during a second etch using a method comprising specifying that a lateral distance between an edge of an opening defined by the second mask set which transects the transistor gate array and an edge of an active area of the plurality of active regions is at least a value "B", where "B" is determined by the formula:

$$\sqrt{(MA_{(POLY\_SUB\ to\ ACTIVE)})^2 + (CD_{(POLY\_SUB)}/2)^2 + (CD_{(ACTIVE)}/2)^2}$$

where "$MA_{(POLY\_SUB\ to\ ACTIVE)}$" is a misalignment of the second mask set to a mask which defines the plurality of active regions, "$CD_{(POLY\_SUB)}$" is a critical dimension of the second mask, and "$CD_{(ACTIVE)}$" is the critical dimension of the mask which defines the plurality of active regions.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures:

FIG. 1A is a plan view.

FIG. 4A is a plan view.

Figure 1B:
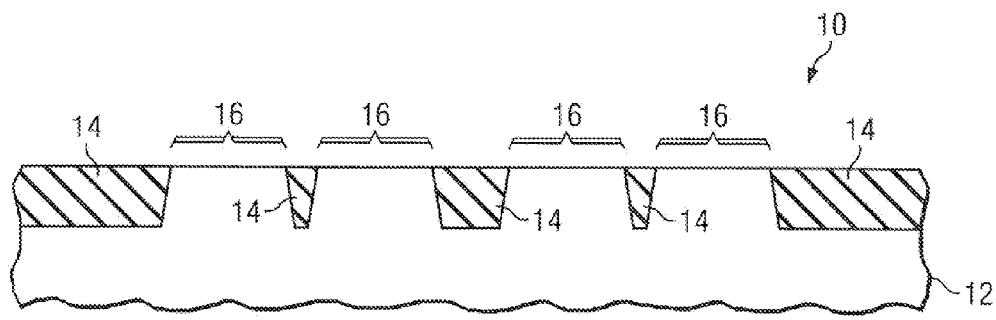
FIG. 1B is a cross section, of an in-process structure in accordance with an embodiment of the present teachings.

It should be noted that some details of the FIGS. have been simplified and are drawn to facilitate understanding of the present teachings rather than to maintain strict structural accuracy, detail, and scale.

DESCRIPTION OF THE EMBODIMENTS

Reference will now be made in detail to the present exemplary embodiment of the present teachings, an example of which is illustrated in the accompanying drawings. Wherever possible, the same reference numbers will be used throughout the drawings to refer to the same or like parts.

For purposes of the present disclosure, a "mask" can include a mask or reticle which can be formed using a chrome pattern (i.e., "mask pattern") on a transparent plate. A "mask layer" can include a layer which has been patterned, or will be patterned either directly or indirectly, with the mask pattern. That is, a "mask layer" can be a photosensitive layer which has been patterned using the mask, as well as a hard mask which has been etched using a photosensitive layer, wherein the photosensitive layer has been patterned with the mask. A "circuit layer" refers to a layer which will be used as part of a circuit during operation of the completed device. A "ghost feature" refers to a layer which can be formed from the circuit layer as a gate assist feature, but which will not be active during operation of the device, or which is removed prior to completion of the device.

As technology nodes continue to decrease, for example, beyond 45 nm or less, a single print, single etch process as described above may become insufficient to accurately reproduce a mask pattern within a mask layer. An embodiment of the present teachings can include the formation of a blanket conductive circuit layer over a semiconductor substrate, followed by a two print, two etch (i.e., "2P2E") process. A 2P2E process is described in U.S. Pat. No. 7,737,016 which is incorporated by reference herein in its entirety. In accordance with an embodiment of the present teachings, the 2P2E process can be implemented using at least one rule from a set of design rules to more accurately reproduce a mask pattern within a circuit layer, such as a layer of polysilicon. In a particular embodiment, the design rules can be used to provide a small extension of a transistor gate past the active region. Without sufficient extension of the transistor gate past the end of the active region, line end shortening and corner rounding can pull the end of the transistor gate back to such an extent that device leakage can occur, severely compromising the device performance. In some cases, a device can be rendered inoperable.

By way of simplified example, a general depiction of a two print, two etch process is depicted in FIGS. 1-7. The first print and etch can generally define the location and outline of the transistor gate lines, while the second print and etch can define the gate line ends, for example by trimming the ends of the transistor gates in the transistor gate array. This process is particularly suited for allowing a small gate line end extension, for example 25 nm, past an edge of an underlying active area. Extending the line end past the underlying active area helps insure good electrical communication between the gate and the active area. However, extending the line end too far past the edge of the active area uses valuable chip real estate while providing no electrical advantage, and can result in the line end being too close to an adjacent feature.

FIG. 1A is a plan view, and FIG. 1B is a cross section along "1B-1B" of FIG. 1A, depicting a portion of a semiconductor wafer substrate assembly 10. It will be understood that the semiconductor wafer substrate assembly 10 can be a portion of a semiconductor wafer, a portion of a semiconductor die, or a portion of a plurality of unsingularized dies. The semiconductor wafer substrate assembly 10 can include a semiconductor substrate 12, such as a silicon substrate, and a dielectric layer 14 such as shallow trench isolation (STI), field oxide, etc., formed in accordance with known techniques. FIGS. 1A and 1B further depict device active regions 16 (active areas) formed, for example, by implanting N-type and/or P-type dopants into the semiconductor substrate 12 according to known techniques with an ACTIVE mask.

Figure 2:
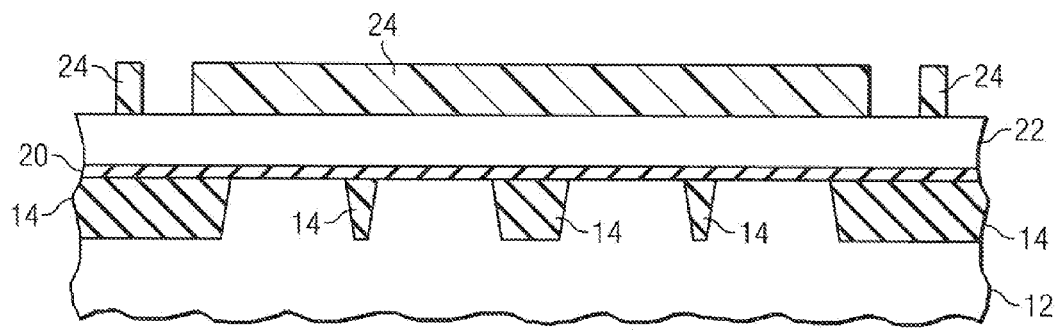
FIG. 2 is a cross section of the structure of FIGS. 1A and 1B structure after forming various additional layers including a patterned first mask layer.

After forming a structure similar to that depicted in FIGS. 1A and 1B, a blanket gate dielectric layer 20 (e.g., gate oxide) and a blanket circuit layer 22 can be formed on the surface of the FIG. 1 structure as depicted in the cross section of FIG. 2. The blanket circuit layer 22 will be patterned with a plurality of transistor gates. The circuit layer 22 can be, for example, doped polysilicon, metal, metal silicide, or a combination. The description below uses the example of a polysilicon circuit layer 22, but it will be understood that other materials can be used instead of polysilicon, or additional layers such as a metal silicide can be used along with the polysilicon. Subsequently, a first patterned mask layer 24 can be formed on the blanket circuit layer 22, for example using optical photolithography including a mask during a first print of the 2P2E process to define a photosensitive layer (e.g., photoresist) to form the first patterned mask layer 24. The pattern depicted is exemplary, as the actual pattern will depend on the design of the device. The first mask layer 24 can be referred to as the POLY mask layer.

Figure 3:
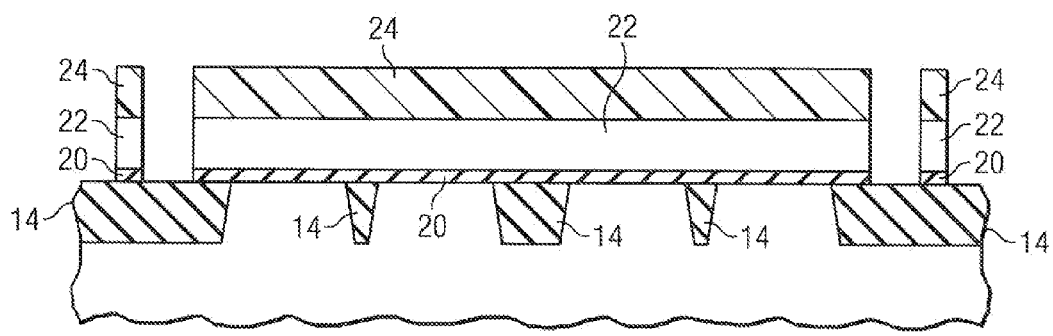
FIG. 3 is a cross section of the FIG. 2 structure after performing a first etch.

Next, the blanket circuit layer 22 and blanket gate dielectric layer 20 are etched using the first mask layer 24 as a pattern during a first etch of the 2P2E process to form a structure similar to that depicted in FIG. 3.

Figure 4B:
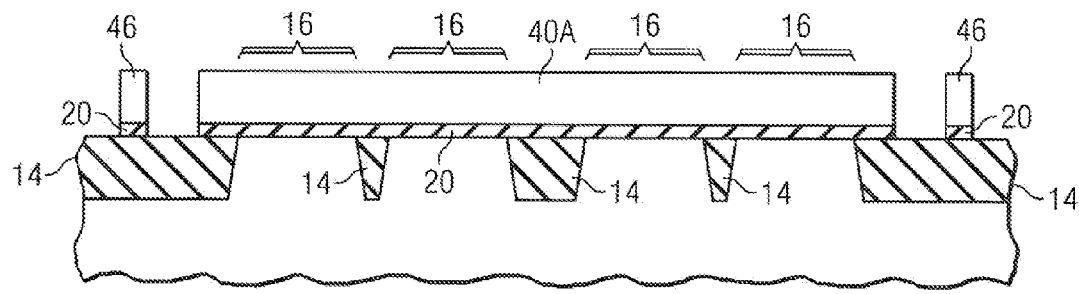
FIG. 4B is a cross section, of the FIG. 3 structure after removing the first mask layer.

Next, the first mask layer 24 is removed to result in the structure depicted in the plan view of FIG. 4A and FIG. 4B. FIG. 4B is a cross section along "4B-4B" of FIG. 4A. The etch using the first mask layer 24 forms active transistor gates 40A-40C and 42A-42C, ghost features 44A-44D, and gate structures 46 and 48, referred to as "field poly".

In the structure of FIG. 4A, the ends of transistor gates 40A-40C and 42A-42C have been formed to extend beyond the edges of active regions 16 more than desired (for example, 60 nm when a 25 nm overlap is desired) to ensure that they extend past the edges of the active regions 16. As the minimum feature size on an IC is reduced and feature density increases, the critical dimension (CD) of the mask which forms the features approaches the resolution limit of the optical exposure tool. This can result in transistor gates which have malformed and shortened line ends. To ensure that the ends of the transistor gates 40, 42 extend beyond the end of the active regions 16, transistor gates 40, 42 are formed longer than desired. However, a minimum distance must be maintained between gates 40, 42 and field poly 46, 48 respectively.

Additionally, forming closely spaced line ends as the feature width approaches the limits of the lithography tool is difficult. Thus while each of transistor gates 40A-40C and 42A-42C are to provide a pair of gates and a pair of gate arrays, two separate gates are formed as a single gate at this process stage.

Figure 5B:
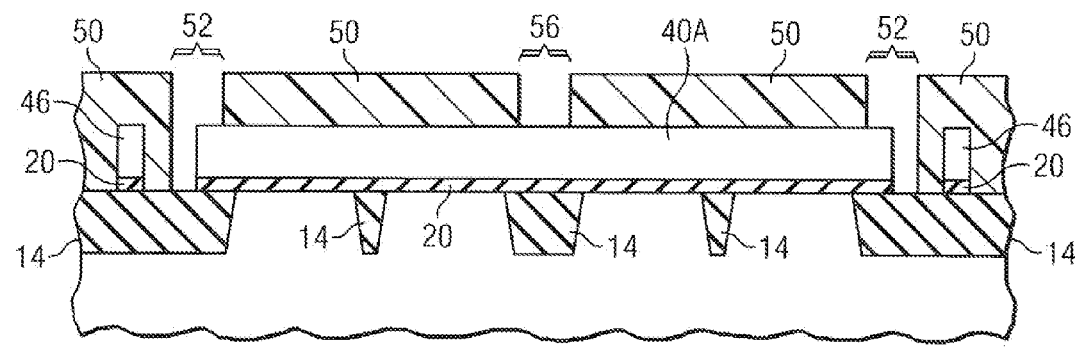
FIG. 5B is a cross section, of the structure of FIGS. 4A and 4B after forming a patterned second mask layer.
Figure 6B:
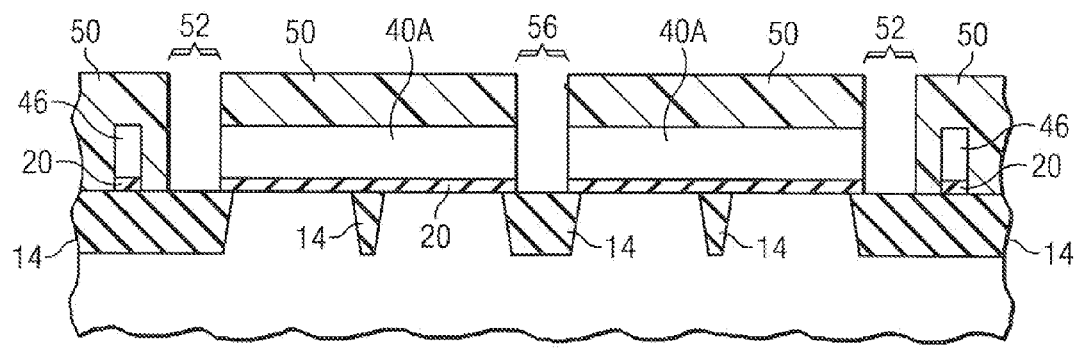
FIG. 6B is a cross section, of the structure of FIGS. 5A and 5B after performing a second etch.
Figure 5A:
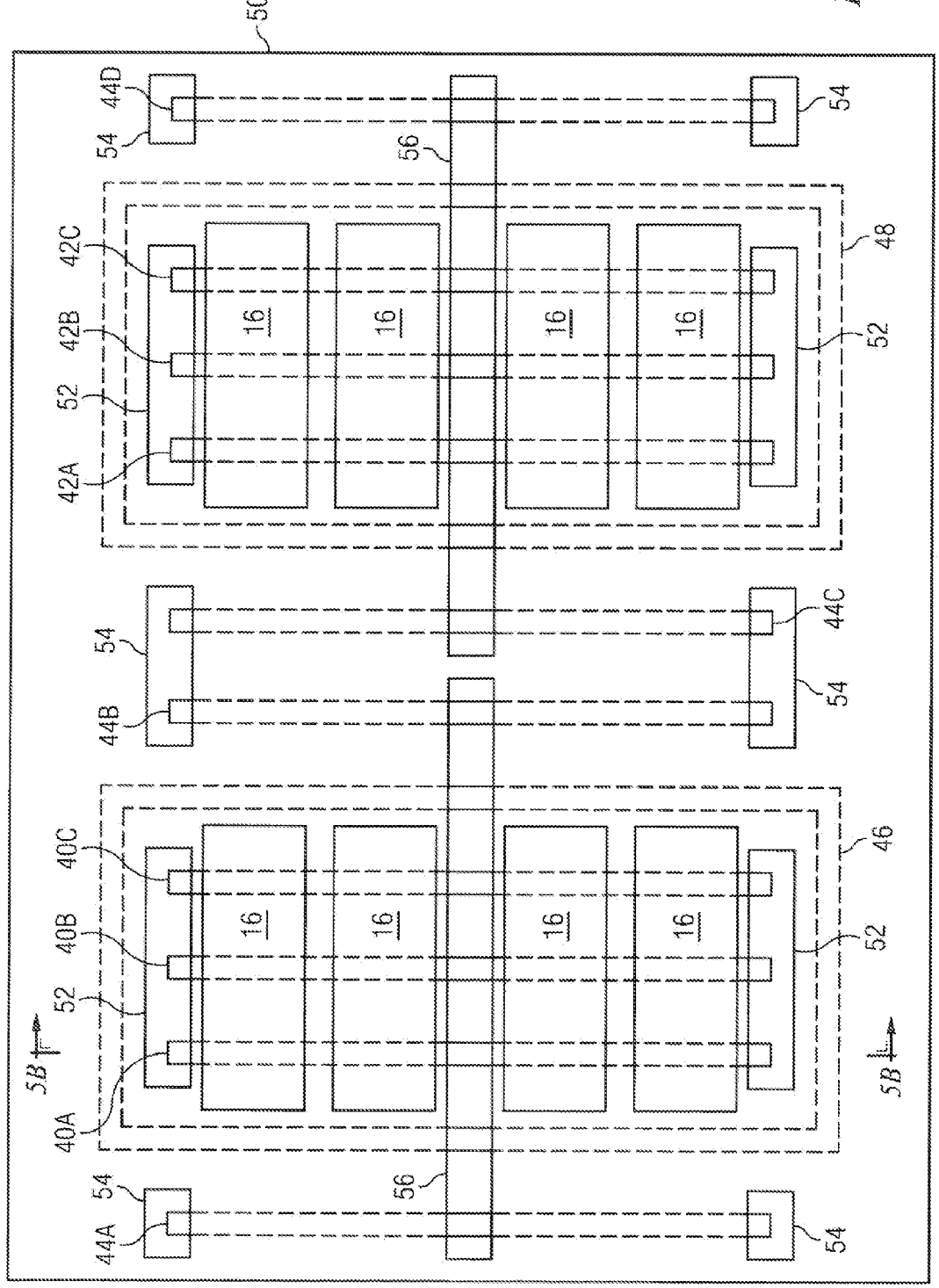
FIG. 5A is a plan view.
Figure 6A:
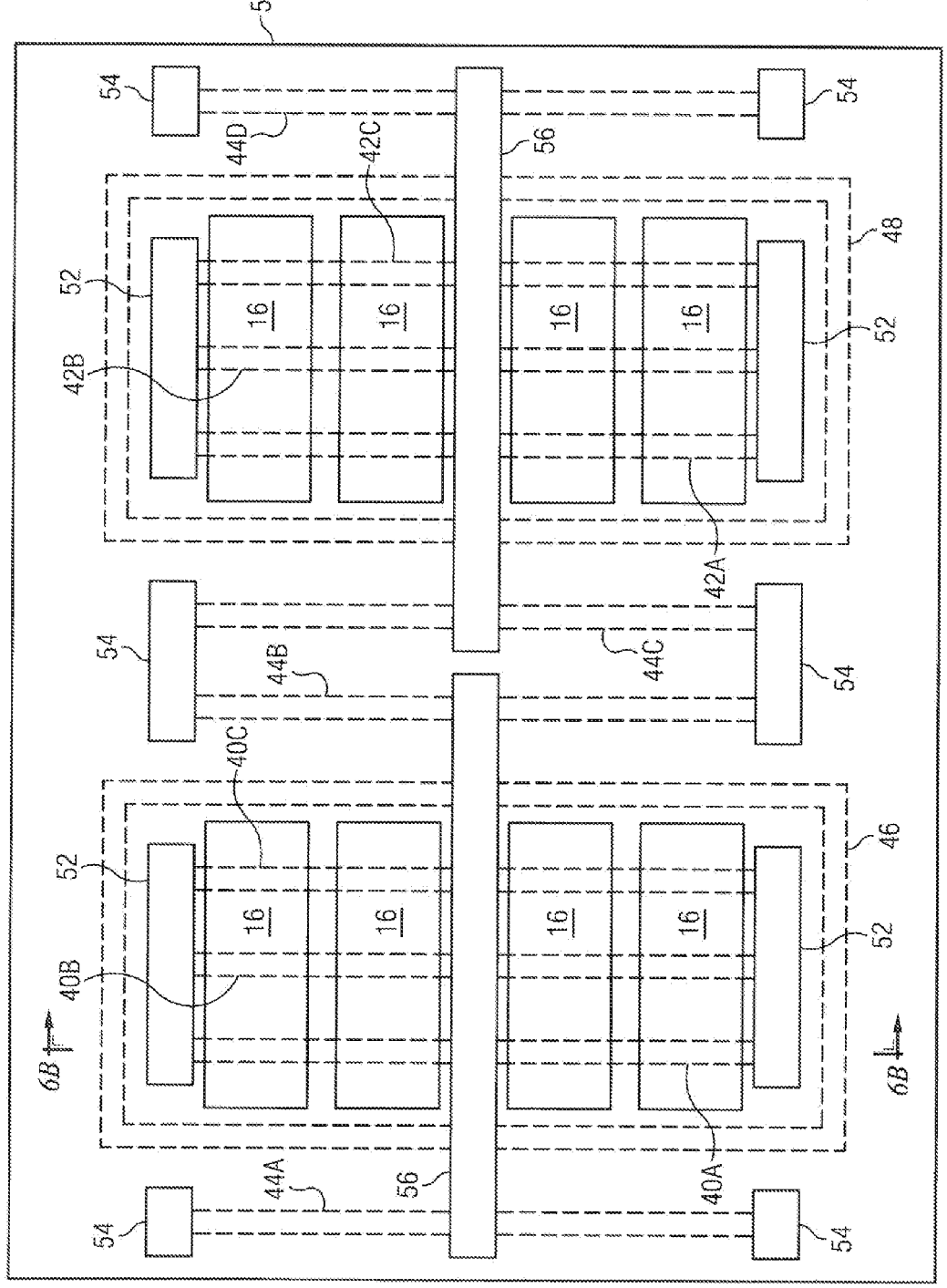
FIG. 6A is a plan view.

To increase the spacing between transistor gates 40, 42 and field poly 46, 48, and to separate each of transistor gates 40A-40C and 42A-42C into a pair of gates, a second mask layer 50 is formed as depicted in FIGS. 5A and 5B. FIG. 5A is a plan view depicting the second mask layer 50, also depicted in the cross section of FIG. 5B taken along "5B-5B" of FIG. 5A. The second mask layer 50 includes first openings 52 which expose line ends of the active transistor gates 40, 42, second openings 54 which expose line ends of the ghost features 44, and third openings 56 which expose the central portions of the each of the active gates 40, 42, the ghost features 44, and the field poly 46, 48. Openings 52 can be formed to expose the line ends of transistor gates 40, 42 near field poly 46, 48 and active areas 16, and to ensure the line ends will extend past the active areas 16 subsequent to an etch. Because the second mask layer 50 is used to remove portions of features formed by the first mask layer 24, second mask layer 50 can be referred to as a polysilicon subtraction or "POLY_SUB" mask layer. The second mask 50 can be defined during a second print of the 2P2E process.

After forming second mask layer 50, an etch of the exposed portions of the transistor gates is performed during a second etch of the 2P2E process. The etch results in the structure depicted in the plan view of FIG. 6A and the cross section of FIG. 6B. The line ends of the transistor gates 40, 42 are trimmed and shortened so that they extend past the active regions 16 by a desired amount. Further, the etch removes any corner rounding from the line ends which might result from the first etch, such that the line ends are square. The etch additionally separates each transistor gate 40A-40C and 42A-42C into two electrically isolated gates.

Figure 7:
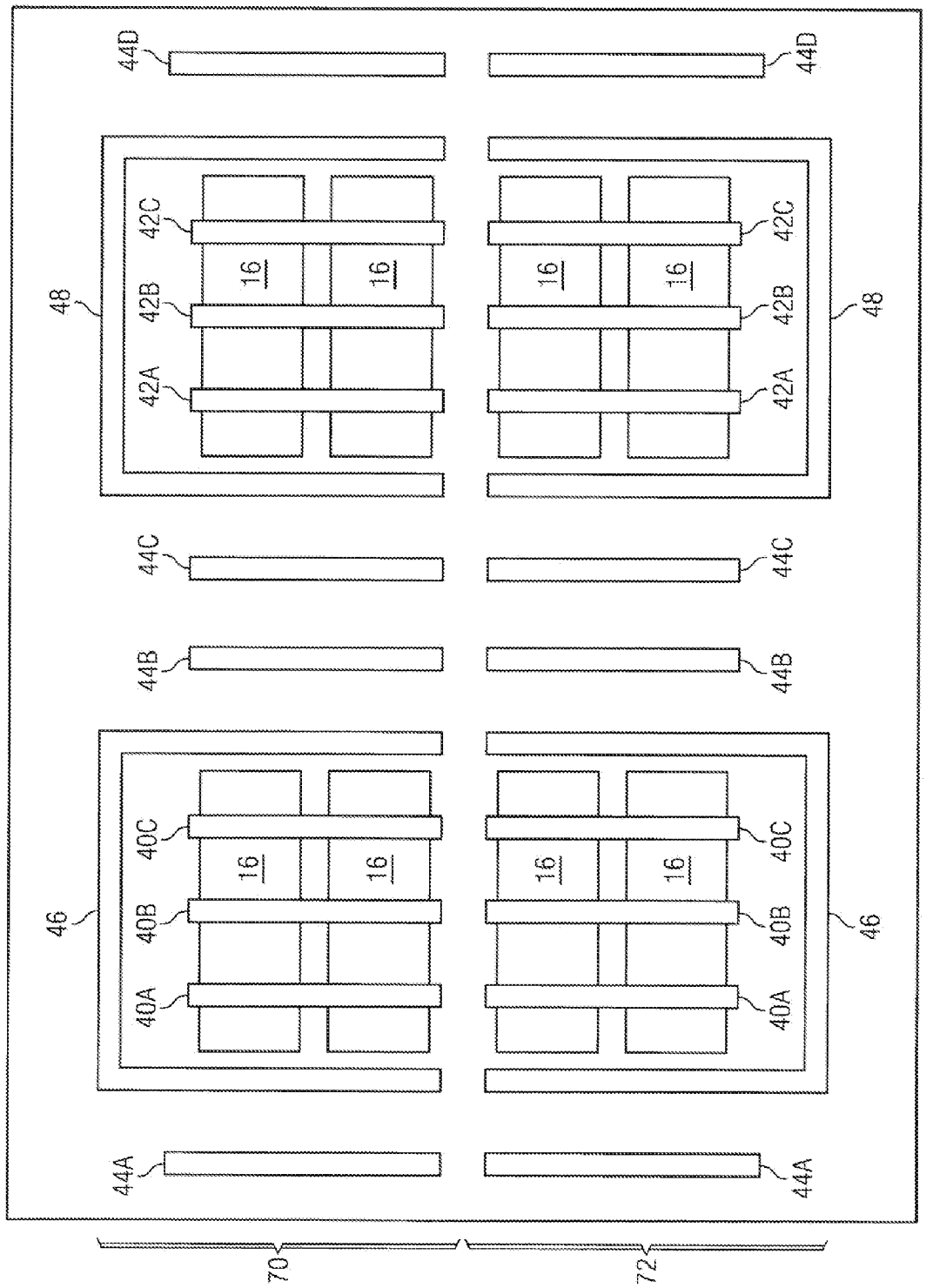
FIG. 7 is a plan view of the structure of FIGS. 6A and 6B after removing the second mask layer.

The etch using mask 50 removes the line ends and the center portions of the transistor gates 40, 42 and the ghost features 44. This etch also removes the center portions of field poly 46, 48. After this etch, the second mask layer 50 is removed to result in the structure of FIG. 7. The 2P2E process described above results in transistor gates 40, 42 and field poly 46, 48 using two mask layers 24, 50 and two etches. This process further removes line end rounding and results in square transistor gate line ends which extend past an active area 16 by a desired amount. Additionally, the ends of the transistor gates 40, 42 are separated from adjacent features such as field poly 46, 48 by a required distance. The openings 56 in the POLY_SUB mask layer 50 result in an etch which transects the gate array and separates the plurality of transistor gates 40, 42 into two separate transistor gate arrays. Specifically, the etch results in an upper transistor gate array 70 and a lower transistor gate array 72 as depicted in FIG. 7.

Figure 8:
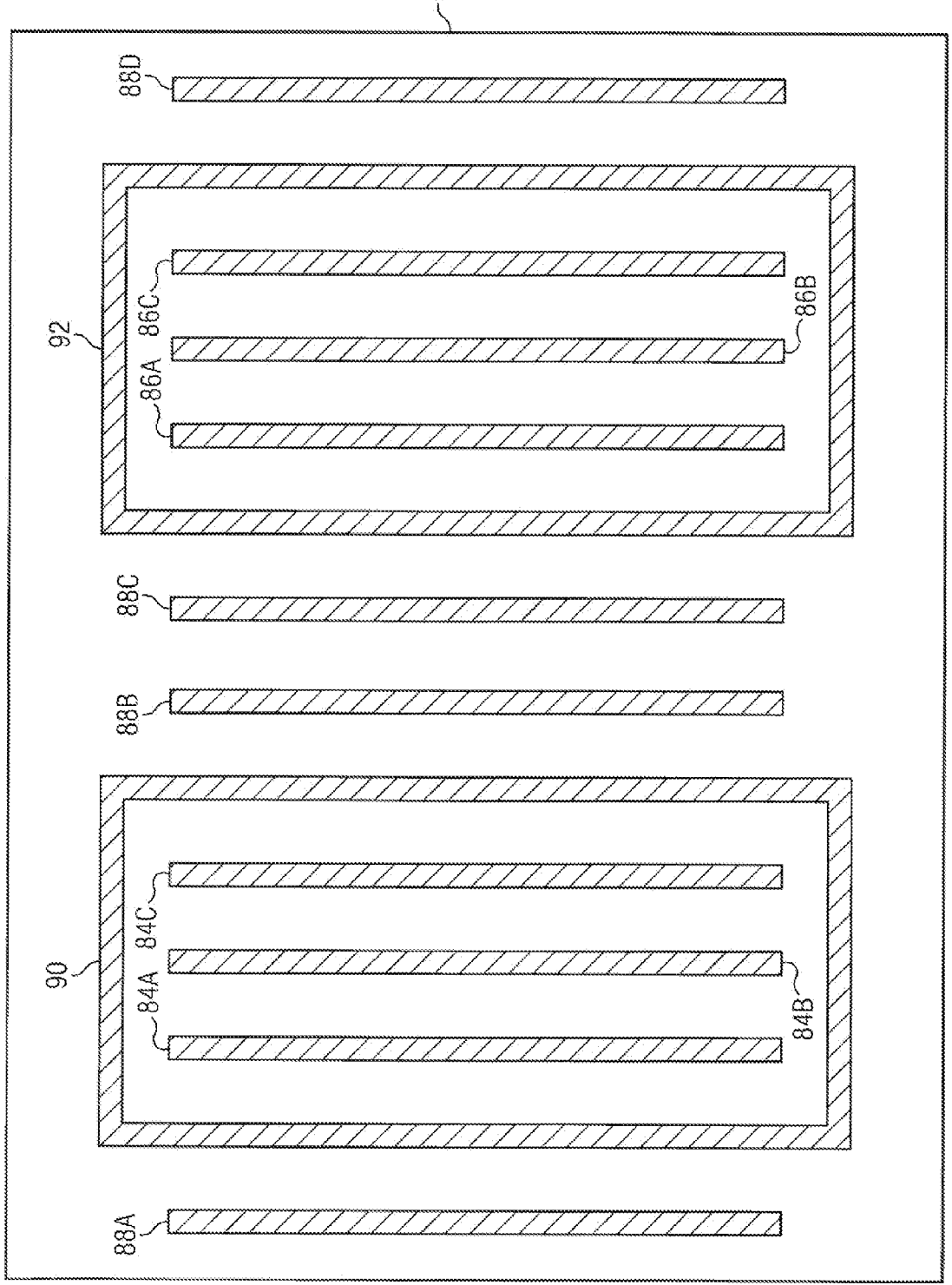
FIGS. 8 and 9 are plan views of masks which can be formed in accordance with the present teachings.

FIG. 8 is a plan view depicting an exemplary first mask 80 (i.e. the POLY mask) having a mask pattern. The POLY mask will be used to pattern a POLY mask layer (for example photoresist), which will be used to define active transistors 40, 42, ghost features 44, and field poly 46, 48 of FIG. 4A (for example polysilicon). The POLY mask 80 includes a transparent plate 82, such as a glass plate, a quartz plate, etc. An opaque material 84-92 is patterned onto the transparent plate, for example by etching one or more layers of chrome. Opaque material 84A-84C and 86A-86C will define active transistors 40A-40C and 42A-42C respectively. Opaque material 88A-88D will define ghost features 44A-44D respectively. Opaque material 90 and 92 will define field poly 46 and 48 respectively. The POLY mask 80 depicted in FIG. 8 can be used with positive photoresist. For negative resist, the transparent and opaque areas can be reversed.

Figure 9:
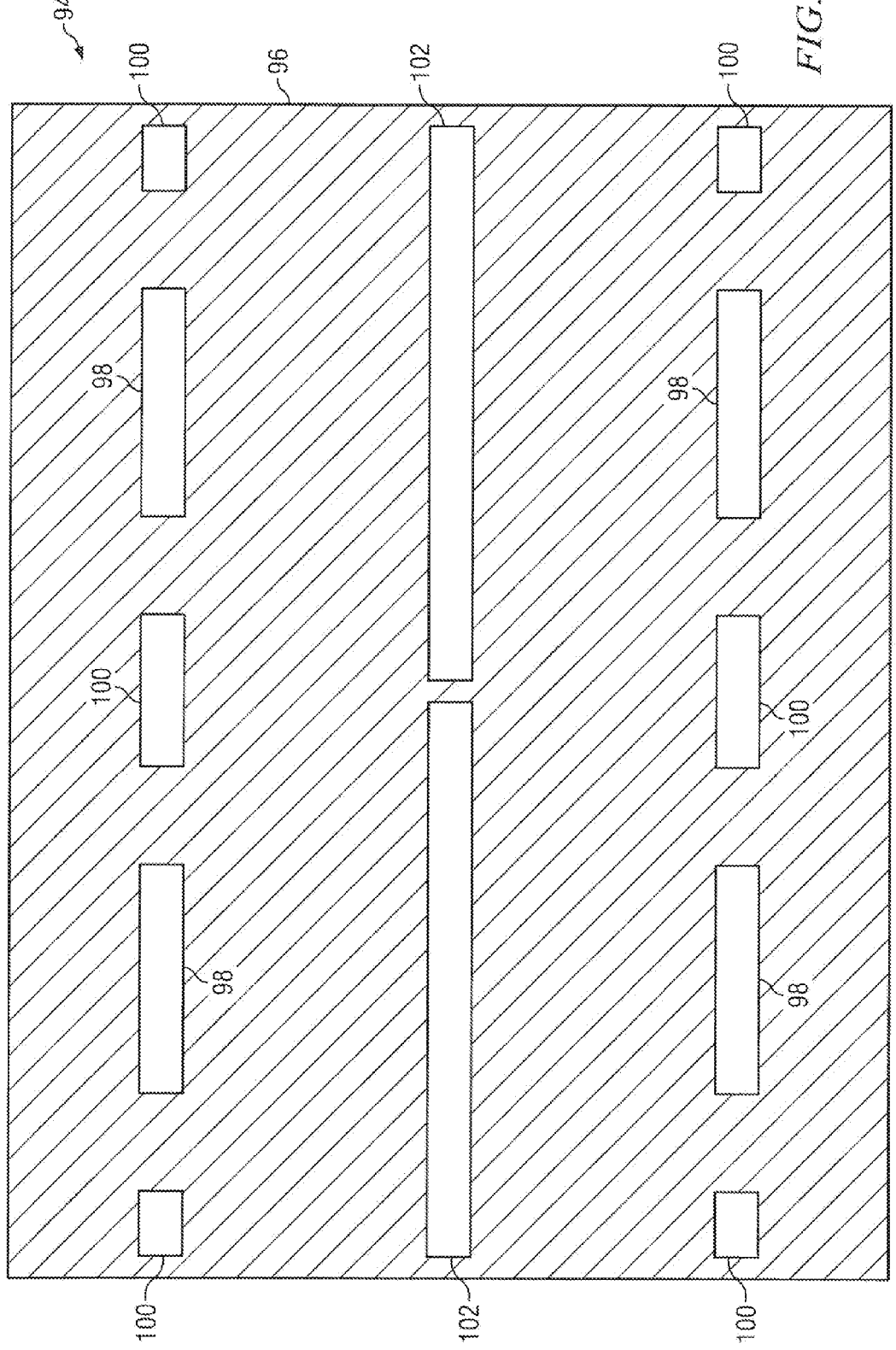

FIG. 9 depicts a plan view depicting an exemplary second mask 94 (i.e. the POLY_SUB mask) which can be used to pattern a POLY_SUB mask layer. The POLY_SUB mask layer can be used to etch the ends of the active transistors 40, 42 and the ghost features 44, and to segment each transistor gate into two separate gates. The POLY_SUB mask 94 includes a transparent plate, such as a glass plate, a quartz plate, etc. An opaque material 96 is patterned onto the transparent plate, for example by etching one or more layers of chrome. The opaque material 96 defines transparent windows or openings 98-102 in the POLY_SUB mask 94. Openings 98 will be used to pattern a photosensitive mask layer (for example photoresist) which will be used to etch line ends of active transistors 40, 42 (for example polysilicon). Windows or openings 100 will be used to pattern the photosensitive mask layer which will be used to etch line ends of ghost features 44, and windows or openings 102 will be used to pattern a photosensitive mask layer which will be used to segment each transistor gate into two separate gates. The mask depicted in FIG. 9 can be used with positive photoresist. For negative resist, the transparent and opaque areas can be reversed.

According to the present teachings, one or more of several design rules can be implemented during the design and formation of a mask set including at least one mask, such as a mask set including the POLY_SUB mask 50. Using these design rules to design and form the mask set can result in masks which more faithful reproduce feature shapes in the circuit layer 22 than masks designed without these rules. Any one of these rules, more than one of these rules, or all of the rules can be implemented during design of the masks. The masks will be used to pattern a mask layer such as a photosensitive layer. The photosensitive layer will then be used to pattern the circuit layer.

Figure 10:
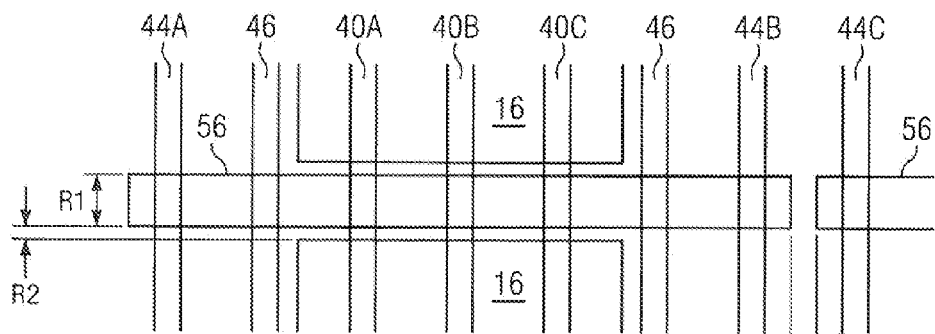
FIGS. 10-16 are plan views of various semiconductor device structures in accordance with the present teachings.

FIG. 10 is a plan view depicting a portion of the FIG. 5A device. While the only portions of the underlying features which would be visible are those exposed by the openings 56 in the mask layer 50, the underlying features are shown in solid lines to aid description. In other words, the portions of the features in dashed lines in FIG. 5A would not be visible in a plan view of the FIG. 10 structure, but are depicted as solid lines for simplicity of explanation. Further, the rules apply to the design of the masks, for example the POLY mask 94 depicted in FIG. 9. Because the design rules can be implemented in a number of different mask types, the explanation below refers to the mask layers formed using the masks, and structures such as active areas formed as part of a semiconductor wafer. Additionally, the distances below generally refer to lateral offsets, typically from an edge of one feature to the closest edge of another feature.

In implementing these rules, the control of the gate length over the active region is maintained at ±10% within the normal process variation from focus, exposure, mask error (i.e., f/E/mask) and misalignment (MA). As with typical processing, the focus budget is determined, in part, by wafer flatness and topography; however, these budgets only reflect the fundamental capability of the scanner and/or the mask writing tool.

A first rule "R1" specifies that a target value for the height of the opening 56 which exposes the center portions of the transistor gates (i.e. the transistor gate portions between two line ends) which is used to segment each of the transistor gates 40, 42 and ghost features 44 into two segments is equal to a certain value "A". In this embodiment, "A" is equal to 70 nm. This dimension is dependent on the process margin limitations (e.g., depth of focus, mask error enhancement factor) through the range of pitches (spaces) required to form the layer. The fixed height "A" assists with control of optical proximity correction (OPC) errors that can lead to reduced process margin (if the feature is excessively small) or electrical fails (if the printed feature is excessively large). In general, rule R1, as well as various other rules as described below, assist with the formation of the gate past the active region by a very small target value (e.g., 25 nm) with adequate manufacturing control. The target height of the opening 56 can be determined by specifying and analyzing very long features during device design, for example infinitely long arrays of gate features overlapped by a single infinitely long POLY_SUB feature, and then specifying actual feature lengths which ensure a ±10% CD control through f/E/mask for the POLY_SUB layer through all possible spacings in X and Y, and the lengths in X. Specifying that this height conforms to this specification results in a sufficient process margin and shape control so that the relatively small value of the distance specified by rule R2 (described below) is manufacturable.

A second rule "R2" specifies that a lateral distance between an edge of opening 56 within the POLY_SUB mask layer 50 and an edge of the active region 16 is at least a value "B", for example where "B" is ≥25 nm. In other words, the lateral distance between the edge of opening 56 within POLY_SUB mask layer 50 and the edge of the active region is B. This rule specifies a target distance for the extension of the transistor gates (40A-40C in FIG. 10) past the active region. This value is specified as a minimum value to ensure that the end of the transistor gates actually extend past the active region. That is, the minimum value for "B" ensures that processing errors to not result in transistor gate line ends which terminate within the active region 16. "B" can be determined by taking the root mean square (RMS) of the misalignment tolerance of the POLY_SUB mask to the ACTIVE mask which defines the active region, the CD control for the POLY_SUB mask, and the CD control for the ACTIVE mask which defines the active region, for example using the formula:

$$\sqrt{(MA_{(POLY\_SUB\ to\ ACTIVE)})^2 + (CD_{(POLY\_SUB)}/2)^2 + (CD_{(ACTIVE)}/2)^2}$$

where "$MA_{(POLY\_SUB\ to\ ACTIVE)}$" is the misalignment of the POLY_SUB mask to the ACTIVE mask, "$CD_{(POLY\_SUB)}$" is the critical dimension of the POLY_SUB mask, and "$CD_{(ACTIVE)}$" is the critical dimension of the ACTIVE mask. The CD control numbers for the POLY_SUB mask include the considerations addressed in rules R1, R5, and R10. Specifying that a lateral distance between these two features conforms to this specification results in line ends which extend past the active region, and helps to minimize the distance of the extension.

Rule R3 specifies that openings within the POLY_SUB mask layer must be spaced in the X-direction by a minimum distance "C". In this embodiment, the X-direction is the direction perpendicular to an axes through the length of the transistor gates. In an embodiment, this value of "C" can be ≥253 nm. Specifying that this spacing conforms to this rule results in a sufficient process margin and shape control so that the relatively small value of the distance specified by rule R2 is manufacturable. Further, R3 helps reduce the occurrence of notching or breaking of field poly running vertically between two POLY_SUB features. Additionally, R3 helps ensure that the features formed by the POLY_SUB mask do not encroach on unrelated POLY features under worst-case f/E/mask and misalignment errors (i.e, "MA"). This rule is effectively quantized in units of contacted pitch. Under worst-case f/E/mask and MA conditions, two POLY_SUB features with a single POLY feature in between them can lead to unintentional breaking of the POLY feature. Therefore, space should be ≥ one pitch of the features formed by the POLY mask, plus the POLY CD, plus 2 times the minimum allowed POLY_SUB space to POLY numbers. The minimum POLY_SUB space to POLY number specifies how close a POLY_SUB feature can be to an adjacent POLY feature that is not intended to be cut by the POLY_SUB, as measured in the "long" direction of the POLY_SUB feature. In an embodiment, this will be equal to 118+36+2*40, or 234.

Figure 11:
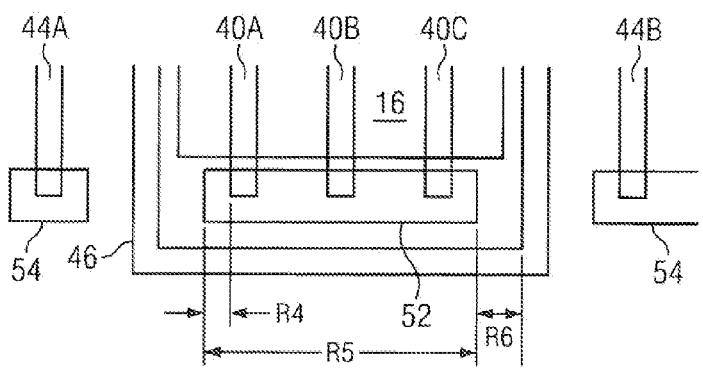

FIG. 11 is a plan view depicting a portion of the FIG. 5A device. A fourth rule "R4" specifies that the opening 52 in the POLY_SUB mask layer 50 must overlap (i.e., extend past) an outside edge of the last (outside) transistor gate 40A of the transistor gate array in the X-direction by at least a certain value of "D". In this embodiment, "D" is ≥45 nm. This value can be determined by ensuring at least ±15% CD control through f/E/mask and MA for the POLY_SUB mask used to cut the end of the array of gate lines formed using the POLY mask. Specifying that this distance is at least a certain value has the effect of ensuring the electrical separation of two features formed using the POLY mask that are intended to be cut using the POLY_SUB mask. In other words, if this value is too small, one or more transistor gates which are to be separated into the upper array 70 and the lower array 72 (FIG. 7) may not, in fact, be separated, resulting in shorting between the two gate lines.

Rule "R5" specifies that a width of the opening within the POLY_SUB mask layer which exposes the ends of the transistor gates must have at least a certain value "E", where the width of the opening is in a direction perpendicular to a longitudinal axis of the transistor gate lines in the transistor gate array. That is, the distance "E" (the width of the opening) is at least a certain value. This value helps ensure a 10% CD control through f/E/mask for a layer formed by the POLY_SUB mask through all possible spacings in the X and Y directions and lengths in the X direction. This rule can be determined by reducing the length of a 2D rectangular feature of specified length from an "infinitely long" case until an unacceptable degradation in process margin is observed.

Rule "R6" specifies that a distance "F" between an edge of opening 52 which exposes the ends of the transistor gates and features formed by a POLY mask layer which are not exposed by the opening in the POLY_SUB mask must be some minimum distance. The features formed by the POLY mask can be formed, for example, by an opening in the poly mask (positive resist). FIG. 11 depicts an instance of rule R6 in the X-direction. A distance between the edge of opening 52 and the edge of field poly 46 must be ≥F. In this embodiment, "F" can be ≥40 nm. This rule ensures at a POLY_SUB feature does not encroach upon a feature formed by the POLY mask under worst-case f/E/mask and MA. In general, R4+R6 must be less than the minimum allowed POLY space (78 nm, in this specific case).

Figure 12:
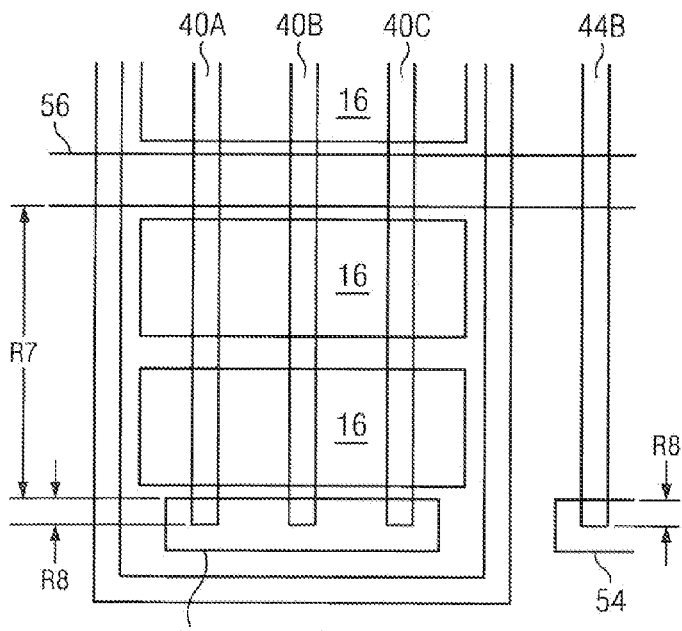

FIG. 12 is a plan view depicting a portion of the FIG. 5A device. A seventh rule "R7" specifies that openings within the POLY_SUB mask layer must be spaced from each other in the Y-direction by a minimum distance "G". In this embodiment, the Y-direction is the direction parallel to an axes through the length of the transistor gates. In an embodiment, this value of "G" can be ≥470 nm. Thus rule helps ensure an adequate space to allow placement of sub-resolution assist features (SRAFs) between POLY_SUB features. In general, optimum illumination conditions for this layer is dictated by imaging requirements for SRAFs. SRAF placement is determined by requirement of 10% CD control through f/E/mask for a long isolated feature at target CD, as indicated by rule "R1". Space for rule "R5" is set so that at least two SRAF features can be placed in between POLY_SUB features defined by openings 52 and 56 in the vertical direction. In this case, a space sufficient for four SRAF features has been specified (SRAF features not depicted).

An eighth rule "R8" specifies that an overlap in the Y-direction between the line ends of the transistor gates 40, 42, and the POLY_SUB mask layer 50 openings 52 which expose the line ends must be an exact value "H". Any overlap in the Y-direction between the line ends of the ghost features 44 and the POLY_SUB mask layer 50 openings 54 which expose the line ends of the ghost features must also be this same value "H". In the present embodiment, H=35 nm. Rule 8 (like rules R11 and R16 described below) helps ensure that any lateral offset in the gate line ends of the upper array 70 relative to the lower array 72 is formed at the middle of the feature formed by the POLY_SUB mask layer. Rule R8 (like rules R11 and R16 described below) provides a controlled environment for specifying the offset rule "R9" described below.

Figure 13:
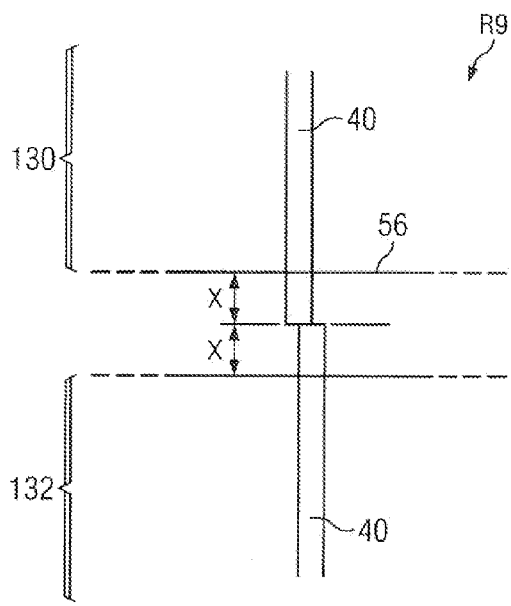

FIG. 13 is a plan view depicting a portion of the FIG. 5A device. Specifically, FIG. 13 depicts an opening 56 in POLY_SUB mask layer 50 which exposes the center portion of each transistor gate between two gate ends. An etch through this opening 56 in POLY_SUB mask layer 50 will form an upper transistor gate array 130 and a lower transistor gate array 132 by transecting the transistor gate lines, which can result in structures similar to the upper transistor gate array 70 and the lower transistor gate array 72 depicted in FIG. 7. In contrast to transistor gate arrays 70, 72 of FIG. 7, in some designs it is desirable to have an upper transistor gate array 130 which is offset from a lower transistor gate array 132. For this particular type of design, a ninth rule "R9" is an "offset rule" which specifies the maximum lateral offset that can occur between transistor gate lines of the upper array 70 relative to the lower array 72 formed by the POLY mask under the POLY_SUB mask. Under the assumptions from rules R8, R11, and R16, as well as f/E/mask control, this rule is determined by calculating OPC contours compared to the distance of the lateral offset, offsetting the OPC contours relative to the distance of the lateral offset to mimic worst-case alignment conditions, then checking the CD of the POLY mask over the ACTIVE mask to ensure the 10% CD control of the POLY feature over ACTIVE condition is met under worst-case alignment conditions.

Figure 14:
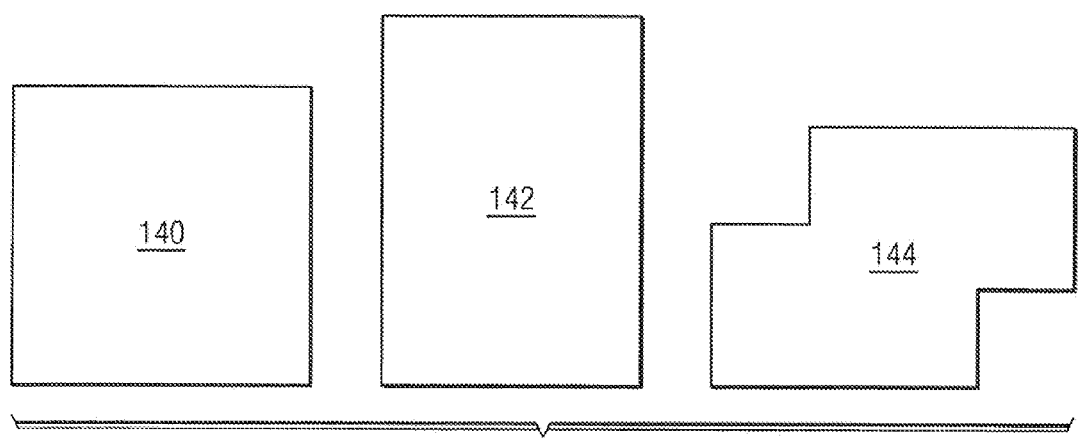

FIG. 14 is an outline of three different POLY_SUB mask layers to demonstrate a tenth rule, "R10," in which the outline of the POLY_SUB mask layer must be square or rectangular. That is, the POLY_SUB mask layer must have exactly four sides and exactly four substantially right angles. Thus shapes 140 and 142 in FIG. 14 are allowed by rule R10, but a shape similar to 144, or other shapes having more than four sides and angles larger or smaller than about 90°, do not conform to rule R10. This rule is "assumed" as an initial design rule, and helps ensure 10% CD control through f/E/mask for the POLY_SUB layer through all possible spacings in the X and Y directions, and lengths in the X direction.

In a design rule R11, the area defined by an outline of the POLY_SUB mask layer 50 must equal the area defined by an outline of the POLY mask layer. In this embodiment, the area of the POLY_SUB mask layer is either 2800 nm$^2$ or 1400 nm$^2$. R11 helps ensure that any jog in the POLY line end resides in the middle of the POLY_SUB layer. This rule (like rules R8 and R16) provides a controlled environment for specifying the offset rule R9.

In rule R12, the openings within the POLY_SUB mask layer must not expose any portion of the active regions 16. That is, no portion of the active regions 16 can directly underlie any of the openings 52, 54, 56 within the mask layer. In other words, no opening in the second mask overlaps any third mask opening which defines one of the plurality of active regions. This rule prevents a double etch of the active regions 16.

In rule R13, the openings within the POLY_SUB mask layer must not expose any features other than the active transistor gates 40, 42, the ghost features 44, or the field polysilicon features 46, 48.

In rule R14, the openings 52, 54, 56 within the POLY_SUB mask layer must expose the features defined by the POLY mask layer. In other words, openings in the second mask must overlap openings in the first mask.

In rule R15, the POLY_SUB spacing to features on the CONT mask (i.e., the mask that is used to make transistor contacts) is at least a certain distance "I". In the present embodiment, I≥18 nm. This rule helps ensure full coverage of the CONT mask by the POLY mask under worst-case f/E/mask and MA. R15 can be determined using the RMS of CONT mask to the POLY mask misalignment+the POLY_SUB mask to POLY mask misalignment+CD control numbers for POLY, POLY_SUB, and CONT.

Figure 15:
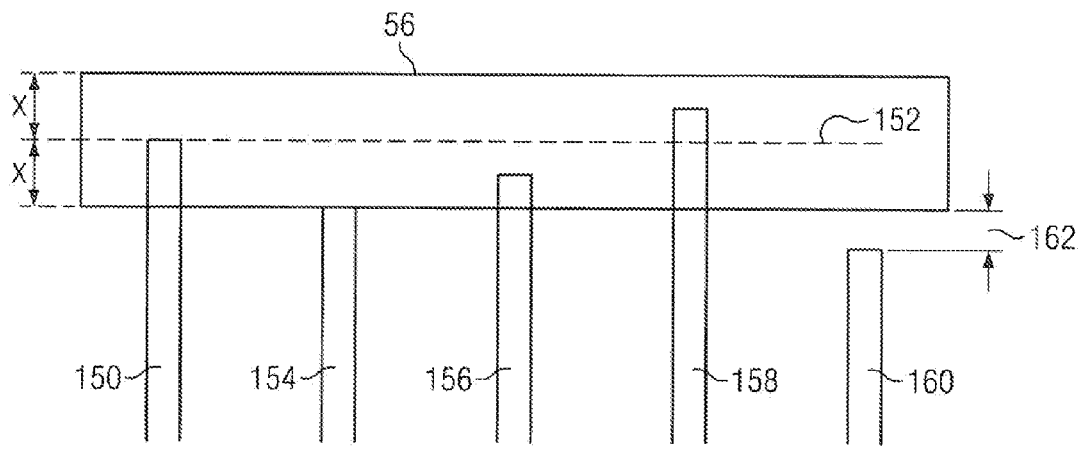

Rule R16 requires that a line end of a transistor gate or ghost feature which is to be exposed by an opening 52 in a POLY_SUB patterned layer must be targeted for the vertical center of the opening 56. FIG. 15 is a plan view depicting an opening 52 in a mask layer which is used to etch the line ends of active transistor gates 40, 42, or ghost features 44. The design of transistor gate 150 is allowed, because the line end of transistor gate 150 is targeted for the center 152 of opening 56. The design of transistor gate 154 is not allowed because it is targeted for an edge of opening 156. The design of transistor gates 156 and 158 is not allowed, because the line ends are targeted for exposure through opening 56, but not for the center 152 of the opening. Rule R16 helps ensure that any jog in the POLY line end resides in the middle of the POLY_SUB feature. One purpose of this is to provide a controlled environment for specifying the offset rule R9.

FIG. 15 also depicts transistor gate 160, which may violate rule R6 in the Y-direction the line end of transistor gate 160 is less than a distance "F" from the edge of opening 56.

Rule R17 relates to the minimum contacted pitch of the local environment around the POLY_SUB mask layer. Minimum contacted pitch (MCP) is a special case of pitch. Minimum contacted pitch is defined as the center-line to center-line distance between two minimum sized gates (e.g., as defined by technology ground rules) that have a single contact placed between the two gates. Rule R17 requires that the openings within the POLY_SUB mask layer are restricted to a local environment around a feature with a length of "L" where 2 times the minimum contacted pitch (MCP)≤L<3 times the MCP (i.e., 2*MCP≤L<3*MCP). Since the ends of the features formed by the POLY_SUB mask are uncontrolled in this case, this rule helps control the environment of the POLY_SUB mask so that only one of the two poly features cut by the POLY_SUB is critical, while the other feature cut by the POLY_SUB could be left partially connected with no electrical impact. The feature just outside of the POLY_SUB on the opposite side could be partially cut with no electrical impact.

Figure 16:
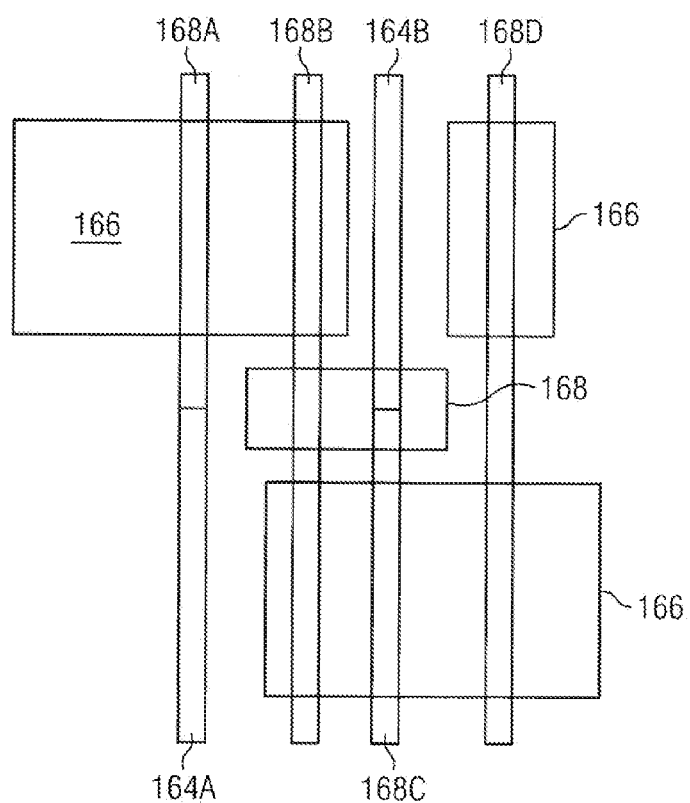

FIG. 16 depicts a particular case for a POLY_SUB mask layer having a feature length L which is 2*MCP. In this particular case, both edges of an opening 162 in a patterned mask layer such as a patterned POLY_SUB mask layer are in proximity of a ghost feature 164A, 164B. In addition to opening 162 and ghost features 164A, 164B, FIG. 16 depicts active regions 166 active transistor gates 168A-168D. In this instance, the opening 168 can be shifted left toward ghost feature 16A if necessary during optical proximity correction (OPC). This can be done to counter effects of poorer POLY_SUB CD control.

Thus using one or more of these design rules can result in a patterning technique which results in a circuit feature having a pattern which more closely matches the mask feature than features formed without these rules.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. In addition, while a particular feature of the disclosure may have been described with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

The invention claimed is:

1. A method for designing a mask set for patterning a mask layer for a semiconductor device, the semiconductor device comprising a plurality of active regions and a transistor gate array comprising a plurality of transistor gate lines, wherein the method comprises:

designing a first mask set for etching the transistor gate array during a first etch; and using a computer, designing a second mask set for etching the transistor gate array during a second etch using a method comprising:

specifying that a lateral distance between an edge of an opening defined by the second mask set which transects the transistor gate array and an edge of an active area of the plurality of active regions is at least a value "B", where "B" is determined by the formula:

$$\sqrt{(MA_{(POLY\_SUB\ to\ ACTIVE)})^2 + (CD_{(POLY\_SUB)}/2)^2 + (CD_{(ACTIVE)}/2)^2}$$

where "$MA_{(POLY\_SUB\ to\ ACTIVE)}$" is a misalignment of the second mask set to a mask which defines the plurality of active regions, "$CD_{(POLY\_SUB)}$" is a critical dimension of the second mask, and "$CD_{(ACTIVE)}$" is the critical dimension of the mask which defines the plurality of active regions.

2. The method of claim 1, further comprising:
specifying that a target value for a height of the opening defined by the second mask set which transects the transistor gate array is equal to a value of "A", where "A" is determined by:
specifying that the transistor gate array has infinitely long arrays of gate features overlapped by a single infinitely long POLY_SUB feature; and
specifying that the first mask defines a transistor gate array length which ensures a ±10% critical dimension control from focus, exposure, and mask error.

3. The method of claim 1, further comprising:
specifying at least two spaced openings in the second mask; and
specifying that a distance between the two spaced openings in the second mask is at least a distance "C", where "C" is ≥one pitch of the transistor gate lines within the transistor gate array added to a critical dimension of the first mask, added to two times the minimum allowed POLY_SUB space to POLY numbers.

4. The method of claim 1 wherein the opening is a first opening and the method further comprises:
specifying a second opening in the second mask, wherein the second opening is designed to trim ends of the transistor gate lines in the transistor gate array; and
specifying that a distance between an edge of an opening in the first mask which defines an outside transistor gate line of the transistor gate array and an edge of the second opening in the second mask is at least a value "D", where "D" is determined by specifying at least a ±15% critical dimension control from focus, exposure, and mask error.

5. The method of claim 1 wherein the opening is a first opening and the method further comprises:
specifying a second opening in the second mask, wherein the second opening is designed to trim ends of the transistor gate lines in the transistor gate array; and specifying that a width of the second opening is at least a value "E", wherein the width of the second opening is measured in a direction perpendicular to a longitudinal axis of the transistor gate array and "E" is determined by specifying an infinitely long 2D feature, then decreasing the length of the specified 2D feature until an unacceptable degradation in process margin is observed.

6. The method of claim 1 wherein the opening is a first opening and the method further comprises:

specifying a second opening in the second mask, wherein the second opening is designed to trim ends of the transistor gate lines in the transistor gate array; and specifying that a distance between an edge of the second opening in the second mask and a feature which will be defined by the first mask but not exposed by the second mask, is a distance "F", wherein the distance "F" is a value which ensures that the POLY_SUB feature formed by the second opening does not encroach on a feature formed by the feature which will be defined by the first mask.

7. The method of claim 1 wherein the opening is a first opening and the method further comprises:

specifying a second opening in the second mask, wherein the second opening is designed to trim ends of the transistor gate lines in the transistor gate array; and specifying that a distance from the edge of the first opening to an edge of the second opening is at least a distance "G", wherein "G" is a value which is sufficient for at least two sub-resolution assist features to be placed between a first feature defined by the first opening and a second feature defined by the second opening in the second mask.

8. The method of claim 1, further comprising:

specifying that the first mask comprises a plurality of openings therein which define the plurality of transistor gate lines;

specifying that the opening in the second mask transects the transistor gate array into a first transistor gate array and a second transistor gate array;

specifying that the first mask forms a lateral offset between transistor gate lines of the first transistor gate array relative to second transistor gate lines of the second transistor gate array;

calculating optical proximity contours relative to the distance of the lateral offset to mimic worst-case alignment conditions; and checking critical dimensions of the second mask over a mask which defines the plurality of active regions to ensure that a 10% critical dimension of the POLY feature over ACTIVE condition is met under worst-case alignment conditions.

9. The method of claim 1, further comprising:

specifying that an outline of the second mask has exactly four sides and exactly four substantially right angles.

10. The method of claim 1, further comprising:

specifying that a first area defined by an outline of the second mask equals a second area defined by an outline of the first mask.

11. The method of claim 1, further comprising:

designing a third mask having a plurality of openings, wherein the plurality of openings in the third mask define the plurality of active regions; and designing openings in the second mask such that no opening in the second mask overlaps any third mask opening which defines one of the plurality of active regions.

12. The method of claim 1, further comprising:

designing the first mask to form at least one feature selected from the group consisting of an active transistor gate, a ghost feature, and a field polysilicon feature; and designing the second mask such that any opening in the second mask exposes only the at least one feature formed by the first mask.

13. The method of claim 1, further comprising:

designing the second mask such that openings in the second mask overlap openings in the first mask.

14. The method of claim 1 wherein the opening is a first opening and the method further comprises:

specifying a second opening in the second mask, wherein the second opening is designed to trim ends of the transistor gate lines in the transistor gate array; and specifying that the first and second masks are designed such that a transistor gate line end formed by the first mask is targeted for a center of the second opening in the second mask.

15. The method of claim 1, further comprising:

specifying that openings within the second mask are designed to form a mask layer having openings, wherein any opening in the second mask layer formed by the second mask are restricted to a local environment around a feature with a length of "L" where 2 times the minimum contacted pitch (MCP)≤L<3*MCP.

* * * * *